US012795815B2

(12) United States Patent
Ozaki et al.

(10) Patent No.: US 12,795,815 B2
(45) Date of Patent: Nov. 10, 2026

(54) OPTICAL MODULE

(71) Applicant: NTT, Inc., Tokyo (JP)

(72) Inventors: Josuke Ozaki, Musashino (JP); Mitsuteru Ishikawa, Musashino (JP)

(73) Assignee: NTT, Inc., Tokyo (JP)

( * ) Notice: Subject to any disclaimer, the term of this patent is extended or adjusted under 35 U.S.C. 154(b) by 254 days.

(21) Appl. No.: 18/845,834

(22) PCT Filed: Mar. 15, 2022

(86) PCT No.: PCT/JP2022/011737
§ 371 (c)(1),
(2) Date: Sep. 10, 2024

(87) PCT Pub. No.: WO2023/175746
PCT Pub. Date: Sep. 21, 2023

(65) Prior Publication Data

US 2025/0203758 A1 Jun. 19, 2025

(51) Int. Cl.
*H05K 1/02* (2006.01)
*H04B 10/40* (2013.01)

(52) U.S. Cl.
CPC ........... *H05K 1/0243* (2013.01); *H04B 10/40* (2013.01); *H05K 1/0218* (2013.01); *H05K 1/0253* (2013.01); *H05K 1/0266* (2013.01); *H05K 1/0274* (2013.01); *H05K 2201/015* (2013.01); *H05K 2201/05* (2013.01); *H05K 2201/094* (2013.01); *H05K 2201/10121* (2013.01)

(58) Field of Classification Search
CPC .. H05K 1/0243; H05K 1/0218; H05K 1/0253; H05K 1/0266; H05K 1/0274; H05K 2201/015; H05K 2201/05; H05K 2201/094; H05K 2201/10121; H05K 1/0219; H05K 1/0245; H04B 10/40; H04B 10/50; H04B 10/60
See application file for complete search history.

(56) References Cited

FOREIGN PATENT DOCUMENTS

JP 2015-146515 A 8/2015

*Primary Examiner* — Timothy J Thompson
*Assistant Examiner* — Aditya Sharma
(74) *Attorney, Agent, or Firm* — Workman Nydegger

(57) ABSTRACT

According to the present disclosure, there is provided an optical module, including: a PCB; a DSP mounted on the PCB; a high-frequency package mounted on the PCB, and including an optical transmission element, an optical modulation element, or an optical reception element; and an FPC that electrically connects a signal pad of the PCB and a signal pad of the high-frequency package, and electrically connects a ground pad of the PCB and a ground pad of the high-frequency package, in which a thickness of a substrate at a location where the ground pads of the PCB and the high-frequency package are disposed is thinner than a thickness of the substrate at a location where each of the signal pads of the PCB and the high-frequency package is disposed, and a thickness of a ground pad of the FPC is thicker than a thickness of a signal pad of the FPC.

8 Claims, 7 Drawing Sheets

OPTICAL MODULE

TECHNICAL FIELD

The present disclosure relates to an optical module including an optical transmitter, an optical modulator, and an optical receiver.

BACKGROUND ART

In recent years, the demand for communication traffic has increased, and along with this, a high-speed optical module compatible with an advanced optical modulation system is required. In the field of optical communications, the introduction of digital signal processing technologies, such as digital coherent, into optical fiber communication systems has led to the establishment of backbone network transmission technology of 100 Gbps (corresponding to 32 GBd operation) per wavelength. Along with this, the speed of optical communications has rapidly increased. At present, advances in digital signal processing technology have enabled high-speed optical communication systems with speeds of 400 to 600 Gbps (corresponding to 64 GBd operation) per wavelength to reach a practical level.

In early 100G digital coherent systems, each component (for example, a driver IC and an optical modulator chip for the modulator, and a transimpedance amplifier (hereinafter referred to as TIA) and an optical receiver chip for the receiver) is individually packaged and then mounted on a printed circuit board (hereinafter referred to as PCB). However, as the speed of optical communications increases (for example, in systems exceeding 400G), optical modules are required to have a wider band (specifically, a modulation band of 40 GHz or more), and thus it is necessary to reduce high-frequency loss. Along with this, it is required to mount the driver IC and the light source chip in the optical transmitter, the driver IC and the optical modulator chip in the modulator, and the TIA and the optical receiver chip in the receiver into the same package by integration.

Furthermore, since such systems exceeding 400G were realized, designs based on differential operation have become commonplace, instead of single-ended operation, with the aim of realizing higher speed, smaller size, and lower power consumption. Currently, with the further expansion of communication traffic demand, discussions have begun on systems that realize even higher speeds, such as 800 Gbps and 1 Tbps (corresponding to 128 GBd operation), and a technology to achieve wider bandwidth and reduce high frequency loss is required.

Until now, surface mount technology (hereinafter referred to as SMT) has generally been used as a high-frequency package for digital coherent optical modules (for example, high bandwidth-coherent driver modulator (HB-CDM) and high bandwidth-intradyne coherent receiver (HB-ICR)). However, in the case of a high-frequency package with an SMT structure, vias and lead pins are required to pass high frequencies, and it is known that these lead to degradation of high-frequency characteristics. Therefore, a new package structure that does not cause degradation of high-frequency characteristics is required.

CITATION LIST

Patent Literature

Patent Literature 1: JP 2015-146515 A

SUMMARY OF INVENTION

Technical Problem

The present disclosure has been made in view of the above-mentioned problems, and an object thereof is to provide an optical module having a new package structure that does not cause degradation of high-frequency characteristics.

Solution to Problem

In order to solve the problem described above, according to the present disclosure, there is provided an optical module, including: a PCB; a DSP mounted on the PCB; a high-frequency package mounted on the PCB, and including an optical transmitter element such as an optical modulator chip, or an optical receiver chip; and an FPC that electrically connects a signal pad of the PCB and a signal pad of the high-frequency package, and electrically connects a ground pad of the PCB and a ground pad of the high-frequency package, in which a thickness of a substrate at a location where the ground pads of the PCB and the high-frequency package are disposed is thinner than a thickness of the substrate at a location where each of the signal pads of the PCB and the high-frequency package is disposed, and a thickness of a ground pad of the FPC is thicker than a thickness of a signal pad of the FPC.

DESCRIPTION OF EMBODIMENTS

Figure 1:
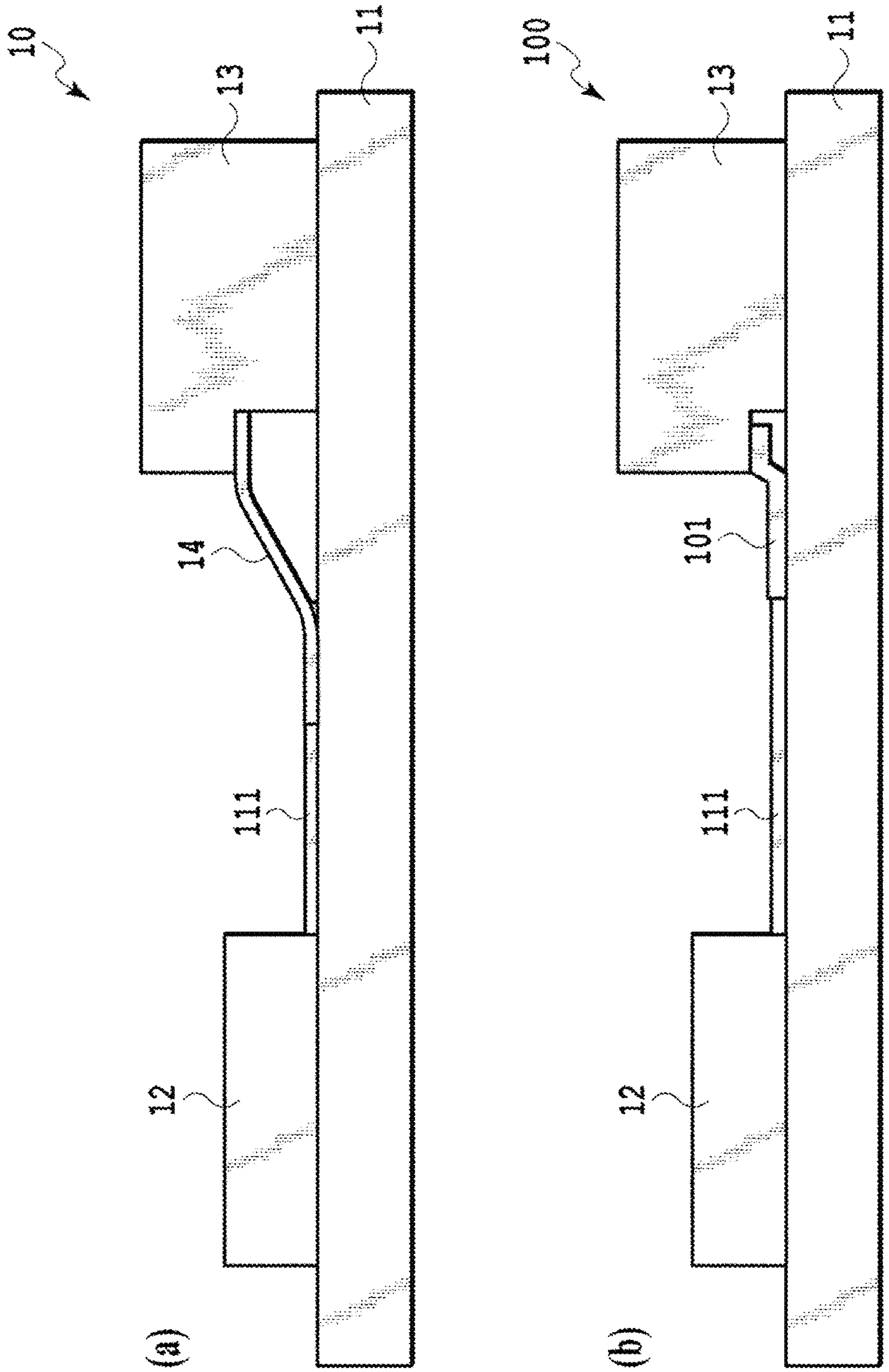
FIG. 1 is a diagram exemplifying a structure of an optical modulator or optical receiver according to a first embodiment of the present disclosure and the related art, with FIG. 1 (*a*) showing a structure of the first embodiment of the present disclosure and FIG. 1 (*b*) showing a structure of the related art.

Various embodiments of the present disclosure are described in detail below with reference to the drawings. The same or similar reference numerals indicate the same or similar elements, and repetitive description thereof may be omitted. The materials and values are for exemplifying purposes and are not intended to limit the scope of the present disclosure. The following description is an example, and some configurations may be omitted or modified, or may be implemented with additional configurations, without departing from the gist of an embodiment of the present disclosure.

An optical modulator or an optical receiver according to the present disclosure has a package structure using a flexible printed circuit (hereinafter referred to as FPC), whereas the related art was implemented using SMT. Accordingly, it is possible to suppress degradation of high-frequency characteristics caused by vias and lead pins, and it is possible to support faster optical communication systems than in the past.

Furthermore, the optical modulator or the optical receiver according to the present disclosure has a fitting structure at the connection pad portion between the substrate (PCB) and the FPC, and between the high-frequency package in which the optical modulation element or the optical reception element is packaged and the FPC, and accordingly, high alignment performance is realized. Accordingly, it is possible to suppress circuits of the wiring due to positional deviation.

In addition, in the optical modulator or the optical receiver according to the present disclosure, at least a part of the ground plane included in the multilayered substrate of the PCB has a cut-out structure. Further, in the ground pad and the signal pad included in the connection pad portion of the PCB, the high-frequency package, and the FPC, the surfaces where the ground pad and the signal pad face each other have a meandering structure. Accordingly, it is possible to increase the degree of freedom in designing impedance.

First Embodiment

Hereinafter, a first embodiment of the present disclosure is described in detail with reference to the drawings. The optical modulator or the optical receiver according to the present embodiment applies an FPC, whereas the related art uses SMT as a mounting technology.

FIG. 1 is a diagram exemplifying the structure of the optical modulator or optical receiver according to the first embodiment of the present disclosure and the related art, with FIG. 1(*a*) showing a structure of the first embodiment of the present disclosure and FIG. 1(*b*) showing a structure of the related art. As shown in FIG. 1(*a*), an optical modulator or optical receiver 10 according to the first embodiment of the present disclosure includes a PCB 11 serving as a substrate; a digital signal processor (hereinafter referred to as DSP) 12 mounted on the PCB 11; a high-frequency wiring 111 mounted on the PCB 11; a high-frequency package 13 including an optical modulation element or an optical reception element; and an FPC 14 that electrically connects the high-frequency wiring 111 and the high-frequency package 13. Although not shown in FIG. 1, the PCB 11, the high-frequency package 13, and the FPC 14 have transmission lines (refer to FIG. 2 described later) and connection pad portions (refer to FIG. 3 described later), and all connection points are soldered together. Although FIG. 1 shows an example in which the DSP 12 for controlling the optical module is mounted on the same PCB 11, the DSP 12 may not necessarily be mounted on the same PCB 11.

On the other hand, as shown in FIG. 1(*b*), an optical modulator or optical receiver 100 according to the related art does not include the FPC 14, but uses a lead pin structure 101 to electrically connect the PCB 11 and the high-frequency package 13. As described above, since the optical modulator or optical receiver 10 according to the first embodiment of the present disclosure is not mounted using the lead pin structure 101, degradation of high-frequency characteristics due to vias, lead pins, or the like does not occur, and it is also possible to support bands equal to or higher than 70 GHz, which is faster than before.

The material used for the core substrate of the above-mentioned FPC 14 (for example, a core substrate 141 described below) may be any one of a liquid crystal polymer, a fluoropolymer, and a polyimide. In particular, when considering broadband performance as a priority, it is desirable to use a liquid crystal polymer or a fluoropolymer with excellent characteristics from the viewpoint of suppressing loss. Furthermore, it is desirable that the FPC 14 and the PCB 11 be connected by soldering. This is due to the fact that high conductivity and bonding strength are required in the connection of this part, and the unit is compact. In addition, because the pitch between the signal pad and the ground pad is narrow, short circuits may occur if welding materials other than solder are used. For this reason, it is most desirable to apply solder bonds that take measures to prevent short circuits while making full use of solder resists. The solder for bonding may be a solder with a melting point of 230° C. or less.

Figure 2:
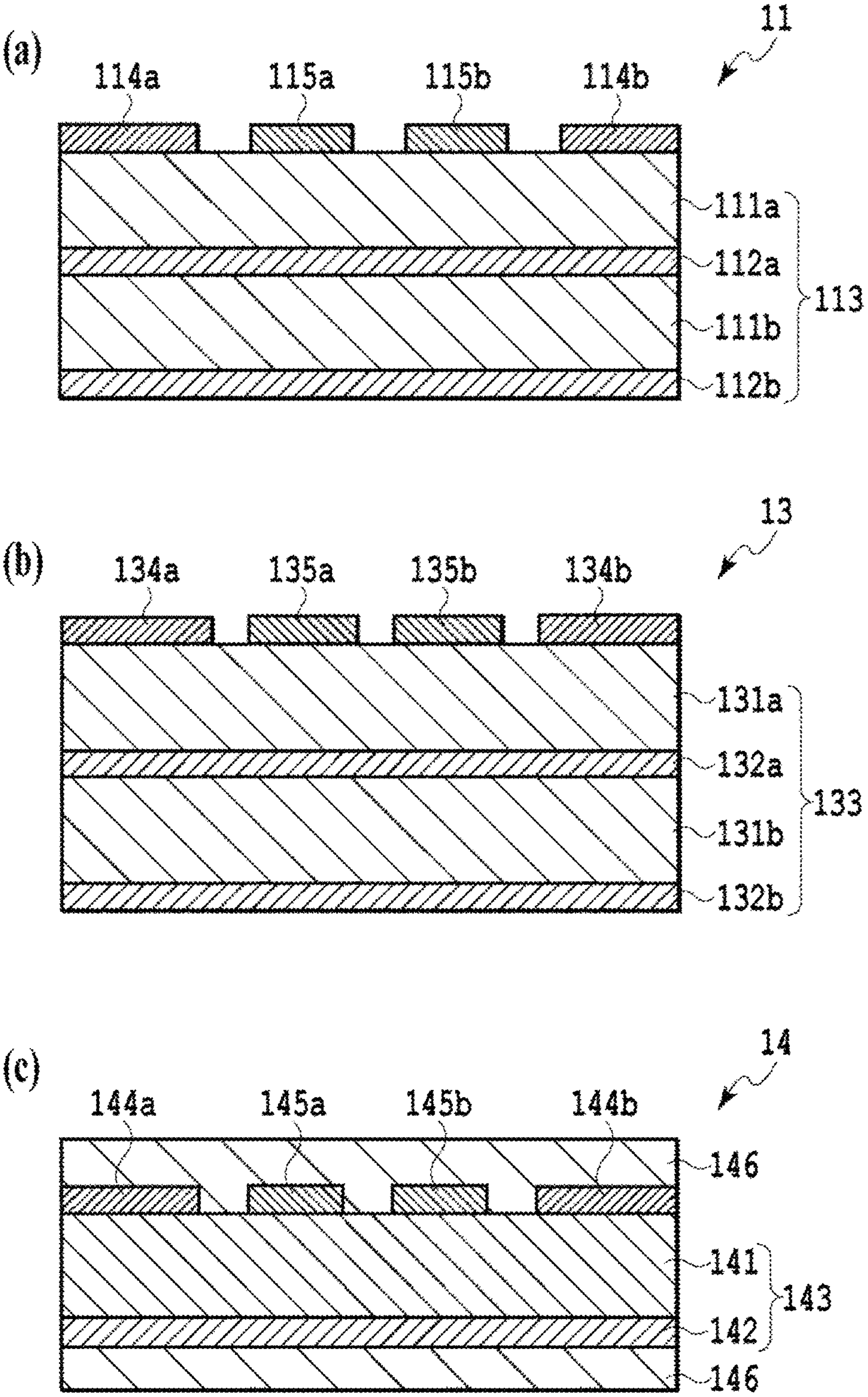
FIG. 2 is a diagram conceptually showing a cross section of a high frequency transmission line portion of a PCB 11, a high-frequency package 13, and an FPC 14, with FIG. 2 (*a*) showing a cross-sectional view of the PCB 11, FIG. 2 (*b*) showing a cross-sectional view of the high-frequency package 13, and FIG. 2 (*c*) showing a cross-sectional view of the FPC 14.

FIG. 2 is a diagram conceptually showing a cross section of high frequency transmission line portion of a PCB 11, a high-frequency package 13, and an FPC 14, with FIG. 2(*a*) showing a cross-sectional view of the PCB 11, FIG. 2(*b*) showing a cross-sectional view of the high-frequency package 13, and FIG. 2(*c*) showing a cross-sectional view of the FPC 14. As an example, in FIG. 2, the configuration of the differential line is ground-signal-signal-ground (GSSG), but the configuration may be GSGSG. Further, although FIG. 2 shows a differential-operational-based structure, a single-end drive configuration may also be used. However, as mentioned above, considering application to a high-speed operation such as 118 GBd operation, GSSG or GSGSG with a differential line configuration is preferable from the viewpoint of high-speed operation and crosstalk.

Further, when there is conversion from GSSG to GSGSG between each component (the PCB 11, the high-frequency package 13, and the like), the shape of the propagation mode changes, and as a result, the high-frequency characteristics may deteriorate. Therefore, it is desirable that the PCB 11, the high-frequency package 13, and the FPC 14 all have the same line configuration. Hereinafter, the configurations of the differential lines described in this specification all are GSSG, by way of example.

As shown in FIG. 2(*a*), the PCB 11 includes a multilayered substrate 113 in which core substrates 111*a* and 111*b* and ground planes 112*a* and 112*b* are layered, and ground pads 114*a* and 114*b* and signal pads 115*a* and 115*b* which are disposed on the surface layer of the multilayered substrate 113. On the other hand, as shown in FIG. 2(*b*), the high-frequency package 13 includes a multilayered substrate 133 in which dielectric layers 131*a* and 131*b* and ground planes 132*a* and 132*b*, which are made of ceramics or the like, are layered; and ground pads 134*a* and 134*b* and signal pads 135*a* and 135*b* which are disposed on the surface layer of the multilayered substrate 133. On the other hand, as shown in FIG. 2(*c*), the FPC 14 includes a multilayered substrate 143 in which a core substrate 141 and a ground plane 142 are layered; ground pads 144*a* and 144*b* and signal pads 145*a* and 145*b* which are disposed on the surface layer of the multilayered substrate 143; and a coverlay 146 covering them. Although FIG. 2 depicts a part without a ground via (not shown) as an example, in reality, since the ground pad (for example, the ground pad 134*a*, the ground pad 144*a*, or the like) and the ground plane (for example, the ground plane 132*a*, the ground plane 142, or the like) are electrically connected, ground vias are disposed periodically in the propagation direction of the high-frequency signal at a pitch sufficiently smaller than the propagation wavelength.

Also, in FIG. 2, each multilayered substrate is depicted with 2 to 4 layers for simplicity, but in reality, layers more than this may be layered, and the thickness of each layer may be set randomly. In addition, in FIG. 2, one channel is depicted, but in actual optical modulators and receivers, there are an I channel and a Q channel, as well as polarization in the X and Y directions, and thus a total of 4 channels are aggregated.

Figure 3:
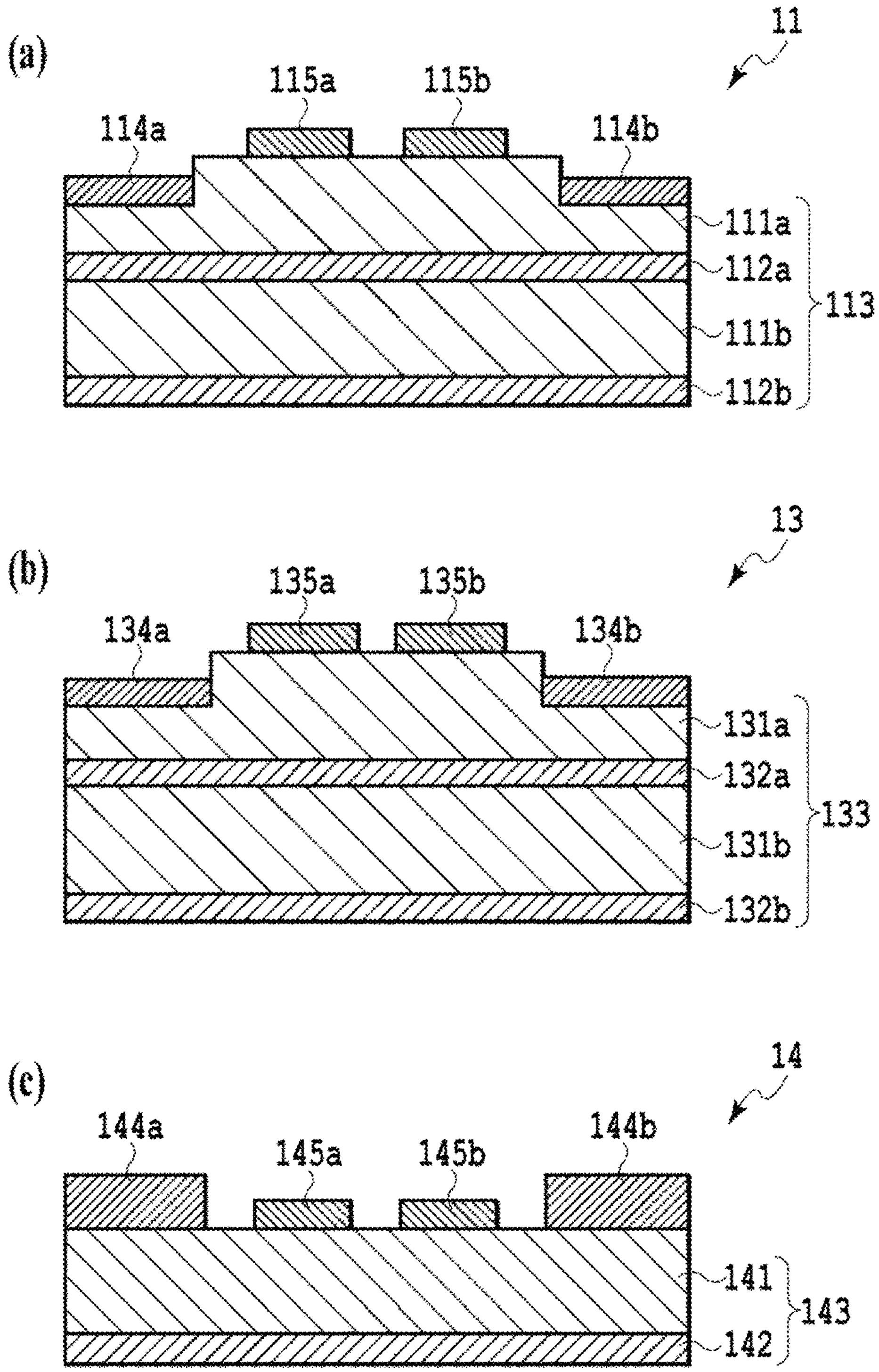
FIG. 3 is a diagram conceptually showing a cross section of a connection pad portion of the PCB 11, the high-frequency package 13, and the FPC 14, with FIG. 3 (*a*) showing a cross-sectional view of the PCB 11, FIG. 3 (*b*) showing a cross-sectional view of the high-frequency package 13, and FIG. 3 (*c*) showing a cross-sectional view of the FPC 14.

FIG. 3 is a diagram conceptually showing a cross section of the connection pad portion of the PCB 11, the high-frequency package 13, and the FPC 14, with FIG. 3(*a*) showing a cross-sectional view of the PCB 11, FIG. 3(*b*) showing a cross-sectional view of the high-frequency package 13, and FIG. 3(*c*) showing a cross-sectional view of the FPC 14. As shown in FIGS. 3(*a*) and 3(*b*), the connection pad portion of the PCB 11 and the high-frequency package 13 has a structure in which the thicknesses of the multilayered substrates 113 and 133 at a location where the ground pads 114*a* and 114*b* and the ground pads 134*a* and 134*b* are disposed is thinner (recessed) than the thicknesses at a location where each of the signal pads (signal pads 115*a* and 115*b* and signal pads 135*a* and 135*b*) is disposed. With such a structure, when the signal pads 145*a* and 145*b* of the FPC 14 are conversely convex, the connection of the connection pad portions between the PCB 11 and the FPC 14 and between the high-frequency package 13 and the FPC 14 has a fitting structure, and thus alignment can be performed with higher accuracy than in the related art.

The ground pads 114*a* and 114*b* of the PCB 11, the ground pads 134*a* and 134*b* of the high-frequency package 13, and the core layer 111*a* at the part where these are disposed are all removed, and the outermost surface of the part may become the ground planes 112*a* and 132*a*. In this case, the ground planes 112*a* and 132*a* function as ground pads.

Generally, when the pad capacitance of a connection portion is large, it becomes difficult to pass a high-frequency signal, and thus it is important to suppress the pad capacitance in order to pass high-speed signals. In the case of optical communication systems that pass high-speed signals such as 118 GBd, the width of each signal pad (the length in the direction in which the ground pads are arranged) must be at least 300 μm, and considering solder connectivity, manufacturing variations, and the like, the width is preferably about 100 to 200 μm. In particular, it is important to reduce the size of pads on PCBs and high-frequency packages that have high dielectric constants. In addition, from the viewpoint of high-frequency characteristics, in order to suppress crosstalk, the channel pitch is preferably 1 mm or more, and the width of the ground pad (the length in the direction in which the signal pads are arranged) is preferably at least 1.5 times or more the width of the signal pad.

On the other hand, when the size of the pad is made small in this manner, positional deviations tend to occur when connecting the PCB 11 and the FPC 14, and the high-frequency package 13 and the FPC 14, respectively. For this reason, the risk of short circuits of the wiring pattern increases, and thus highly accurate positioning is required. With such a fitting structure, the optical module 10 in which the PCB 11, the high-frequency package 13, and the FPC 14 are mounted according to the first embodiment of the present disclosure can support high-speed optical communication corresponding to 118 GBd operation while realizing high alignment performance.

In FIG. 3, the fitting structure is depicted by making the thicknesses of the ground pads 144*a* and 144*b* disposed in the FPC 14 thicker than the signal pads 145*a* and 145*b*, but the fitting structure may be realized by adjusting the thickness of the solder for bonding.

Figure 4:
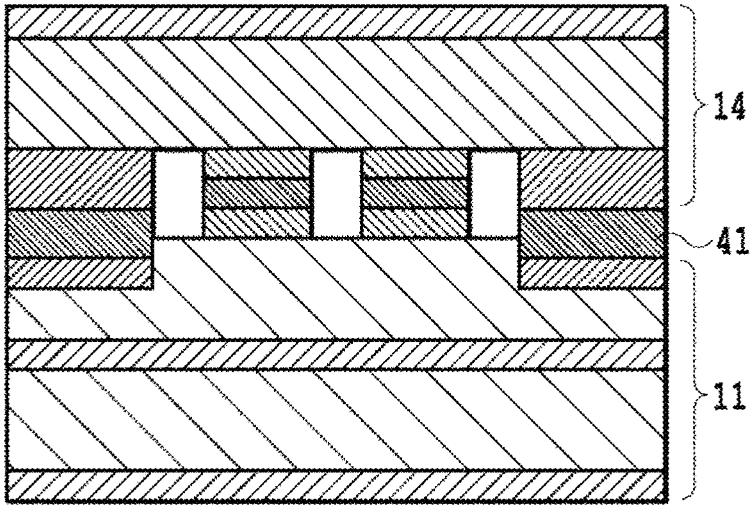
FIG. 4 is a cross-sectional view exemplifying a structure of a connection pad portion of the PCB 11 and the FPC 14 after connection according to the first embodiment of the present disclosure.

FIG. 4 is a cross-sectional view showing the structure of the connection pad portion of the PCB 11 and the FPC 14 after connection according to the first embodiment of the present disclosure. In the connection pad portion between the PCB 102 and the FPC 104 according to the first embodiment of the present disclosure, the connection portion is connected by a solder 41. As described above, in the PCB 11 according to the first embodiment of the present disclosure, the thickness of the multilayered substrate 113 at the part where the ground pads 114*a* and 114*b* are disposed is thin. Therefore, when connected to the FPC 14, the volumes of the ground pads (connection portion between ground pad 114*a* and ground pad 144*a* and connection portion between ground pad 114*b* and ground pad 144*b*) covering each connection portion between the signal pad 115*a* and the signal pad 145*a* and between the signal pad 115*b* and the signal pad 145*b* are larger than those in the related art. Therefore, inter-channel crosstalk is reduced and better high-frequency characteristics are realized. Although FIG. 4 shows the connection portion between the PCB 11 and the FPC 14 as an example, the same can be said for the connection portion between the high-frequency package 13 and the FPC 14.

As described above, the optical module 10 according to the first embodiment of the present disclosure uses the FPC 14 to electrically connect the PCB 11 and the high-frequency package 13, and thus the effect of suppressing degradation in high-frequency characteristics due to vias at the connection portion is achieved. In addition, unlike the related art, since the connection is made by a fitting structure, the optical module 10 according to the first embodiment of the present disclosure has high alignment performance. Therefore, by reducing the size of each pad (ground pad or signal pad), while suppressing pad capacitance, the effect of making it possible to reduce the risk of wiring short circuits due to positional deviation or the like is achieved.

Second Embodiment

Hereinafter, a second embodiment of the present disclosure is described in detail with reference to the drawings. The optical module according to the present embodiment relates to an aspect in which at least a part of the ground plane in the PCB and the multilayered substrate of the high-frequency package has a cut-out structure with the center cut out.

Figure 5:
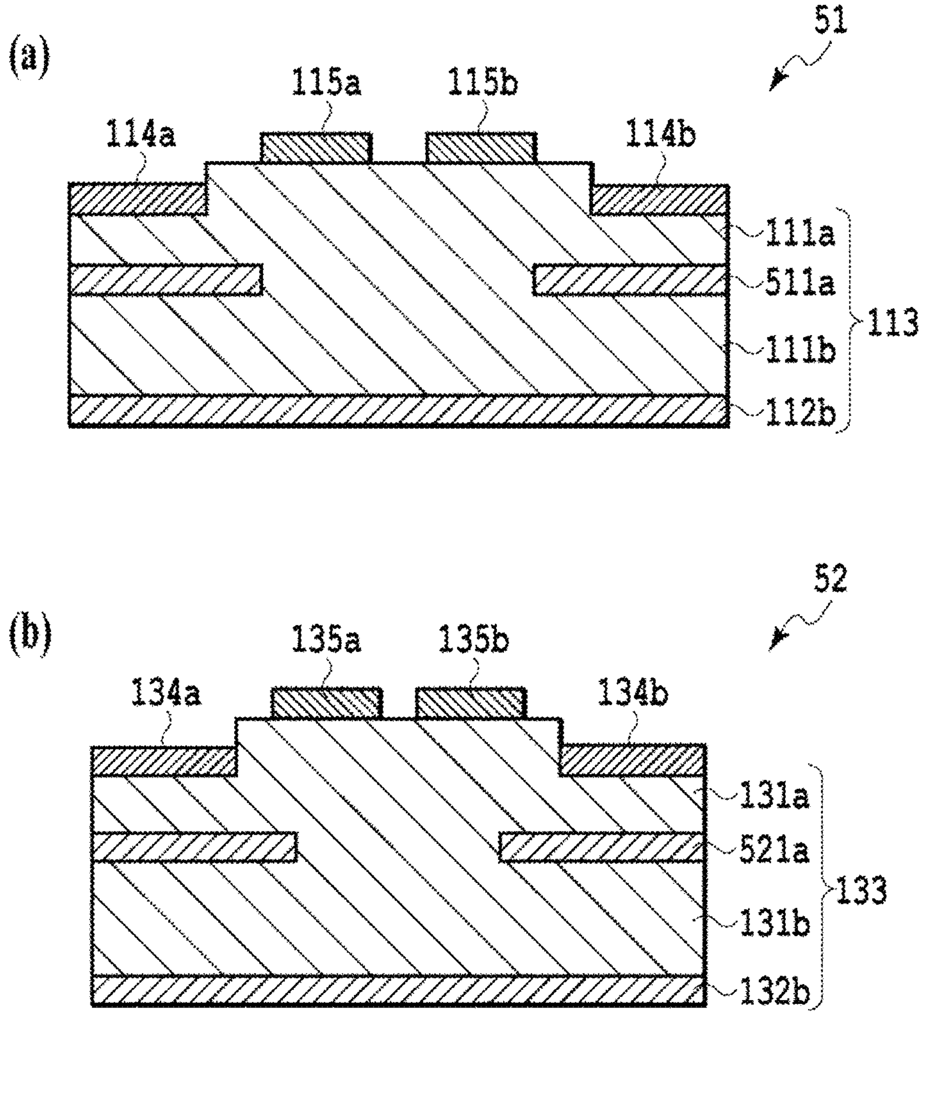
FIG. 5 is a cross-sectional view showing a structure of each connection pad portion of a PCB 51 and a high-frequency package 52 according to a second embodiment of the present disclosure, with FIG. 5 (*a*) showing a cross-sectional view of the PCB 51 and FIG. 5 (*b*) showing a cross-sectional view of the high-frequency package 52.

FIG. 5 is a cross-sectional view showing a structure of each connection pad portion of a PCB 51 and a high-frequency package 52 according to a second embodiment of the present disclosure, with FIG. 5(*a*) showing a cross-sectional view of the PCB 51, and FIG. 5(*b*) showing a cross-sectional view of the high-frequency package 52. As shown in FIG. 5, the basic structures of the PCB 51 and the high-frequency package 52 according to the present embodiment are the same as those of the PCB 11 and the high-frequency package 13 shown in FIG. 3, but the centers of some of the ground planes (a ground plane 511*a* and a ground plane 521*a* in FIG. 5) have a cut-out structure in which a part is cut out. With such a structure, the impedance of the differential signal can be increased, while the value of the common mode impedance can be prevented from increasing. Therefore, in the optical module on which the PCB 51 and the high-frequency package 52 are mounted, there is an effect that the degree of freedom in designing impedance is increased.

However, the range of the cut-out is set not to extend to the area immediately below the ground pads (the ground pads 114*a* and 114*b*, the ground pads 134*a* and 134*b*) disposed on the surface layer. This is because when the area immediately below the ground pad disposed on the surface layer is cut out, the common mode impedance also increase, and the high-frequency characteristics may deteriorate accordingly.

In addition, in FIG. 5, as an example, the ground planes 511*a* and 521*a* have a cut-out structure, but when the number of layered layers of the multilayered substrates 113 and 133 increases, the number of ground planes with a cut-out structure may be determined randomly depending on the condition of impedance matching. However, it is preferable that the ground plane (the ground plane 111*b* and the ground plane 132*b* in FIG. 5) disposed at the bottom layer does not have a cut-out structure because the electromagnetic field may leak and spread.

In this manner, by forming at least a part of the ground plane into a cut-out structure in which a part of the center is cut out, it is possible to improve the impedance of differential signals and, conversely, to suppress the common mode impedance. That is, the optical module in which the PCB 51 and the high-frequency package 52 according to the present embodiment are mounted has the effect of being compatible with higher-speed optical communication than the related art, and having a higher degree of freedom in designing impedance.

Third Embodiment

Hereinafter, a third embodiment of the present disclosure is described in detail with reference to the drawings. The optical module according to the present embodiment has a meandering structure for the ground pad and the signal pad, thereby increasing the degree of freedom in designing impedance.

Figure 6:
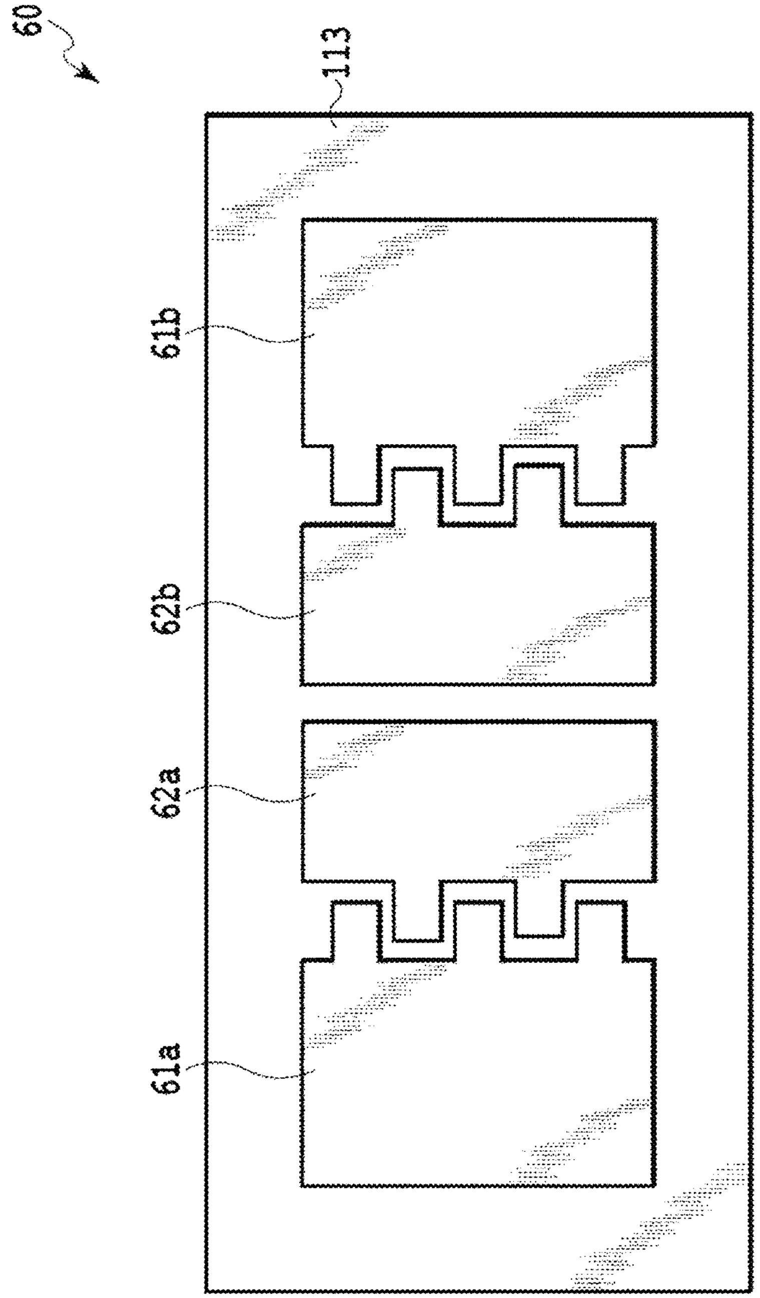
FIG. 6 is a plan view showing a structure of a PCB 60 according to a third embodiment of the present disclosure.

FIG. 6 is a plan view showing the structure of a PCB 60 according to a third embodiment of the present disclosure. FIG. 6 is depicted as a top view of the PCB 60. As shown in FIG. 6, the PCB 60 according to the present embodiment includes ground pads 61*a* and 61*b* and signal pads 62*a* and 62*b* having a meandering structure on the outermost surface of the multilayered substrate 113. Here, the meandering structure is introduced only on the surface where the ground pad and the signal pad face each other, and is not introduced on the end surface (the surface where there is no facing ground pad or signal pad) side. In FIG. 6, a PCB is shown as an example, but a ground pad and a signal pad having a meandering structure may be similarly disposed for a high-frequency package and an FPC.

In the optical module including the ground pads 61*a* and 61*b* and the signal pads 62*a* and 62*b* according to the present embodiment configured as described above, particularly, it is possible to add capacitance to the common mode side, and suppress the common mode impedance. However, when the arrangement of the ground pads and the signal pads is such that S and S face each other, as in GSSG, no meandering structure is introduced between S and S. This is because when a meandering structure is also introduced between S and S, capacitance is also added to the differential impedance, and the differential impedance also decreases. In addition, depending on the shape of the meandering structure, when the meandering structure is introduced to affect the differential signal side which is the main signal, the high frequency signal may be affected. Therefore, it is preferable to introduce the meandering structure only between G and S.

In the optical module according to the present embodiment having such a configuration, it is conceivable to introduce an alignment mark in order to provide even higher alignment performance.

Figure 7:
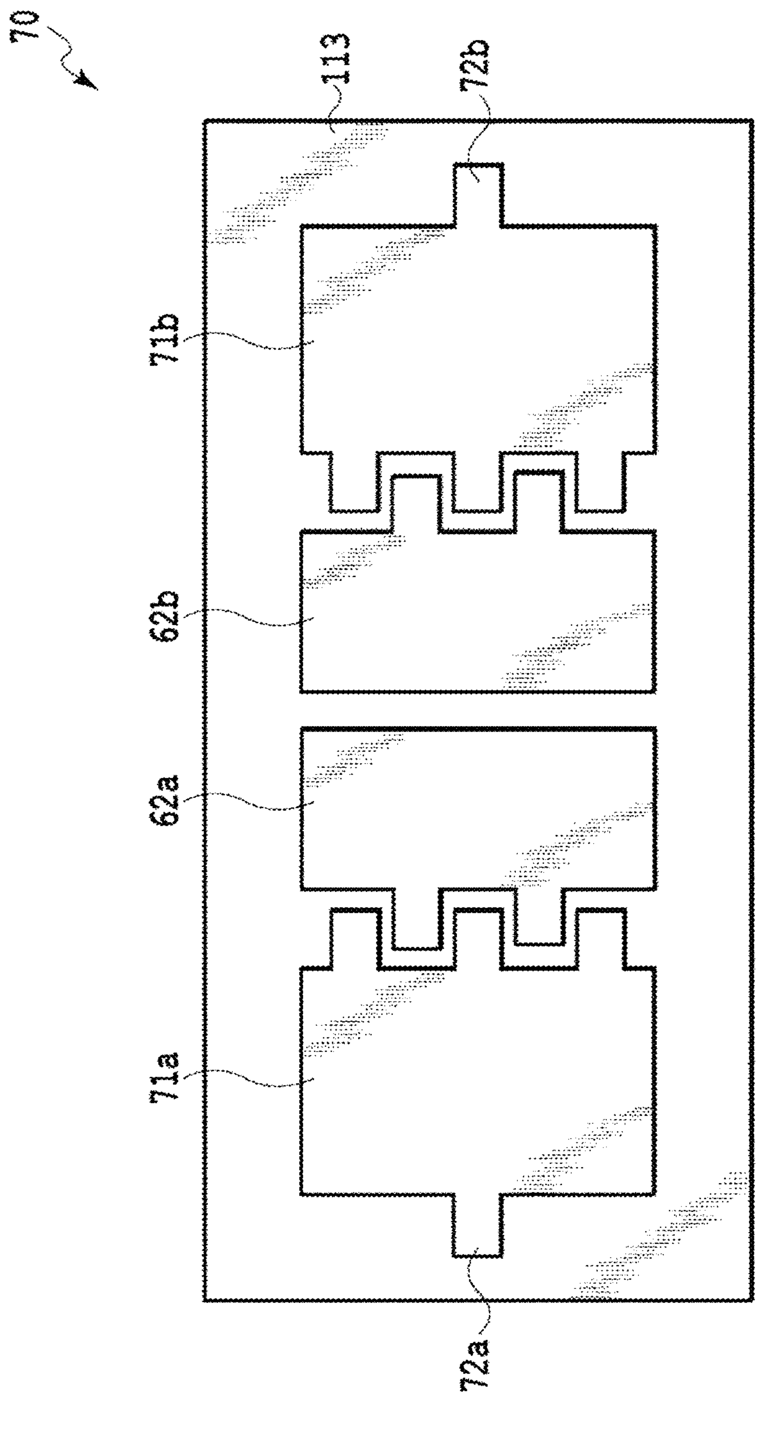
FIG. 7 is a diagram showing a structure of a PCB 70 having ground pads 71*a* and 71*b* into which alignment marks 72*a* and 72*b* are introduced according to the third embodiment of the present disclosure.

FIG. 7 is a diagram showing the structure of a PCB 70 having ground pads 71*a* and 71*b* into which alignment marks 72*a* and 72*b* are introduced according to the third embodiment of the present disclosure. Similar to FIG. 6, FIG. 7 shows a top view of the PCB 70. As shown in FIG. 7, the ground pads 71*a* and 71*b* included in the PCB 70 according to the present embodiment further include alignment marks 72*a* and 72*b* on the end surfaces. In FIG. 7, a PCB is shown as an example, but a ground pad and a signal pad having an alignment mark may be similarly disposed for a high-frequency package and an FPC.

In the optical module including the ground pads 71*a* and 71*b* and the signal pads 73*a* and 73*b* according to the present embodiment configured as described above, since the optical module can be mounted while being aligned based on the alignment marks 72*a* and 72*b* described above, high alignment performance can be realized, and wiring short circuits can be suppressed. However, when the mounting space increases due to the introduction of the alignment mark, the high-frequency characteristics may be affected. Therefore, the alignment mark is preferably introduced only to the ground pad disposed on the outermost side.

In the present embodiment, it is described that the alignment marks 72*a* and 72*b* described above are introduced into the ground pad having the meandering structure. However, the same effect can be obtained even when the alignment marks are introduced into the ground pad not having the meandering structure as described in the related art and the first and second embodiments.

INDUSTRIAL APPLICABILITY

As described above, the optical module according to the present disclosure connects components such as a PCB and a high-frequency package using an FPC, and thus it is possible to suppress degradation of high-frequency characteristics caused by vias and support faster optical communication than the related art. In addition, by reducing the thickness of the multilayered substrate at a location where the ground pad is disposed, a fitting structure is achieved, and thus it is possible to provide high alignment performance, and to suppress short circuits in the wiring pattern caused by positional deviation. In addition, the degree of freedom in designing impedance is increased by forming some ground planes into a cut-out structure or forming respective surfaces of the ground pad and the signal pad facing each other into a meandering structure. The optical module according to the present disclosure, which provides such effects, is expected to be applied to optical communication systems faster than conventional ones, such as 800 Gbps and 1 Tbps.

The invention claimed is:

1. An optical module, comprising:

a PCB;

a DSP mounted on the PCB;

a high-frequency package mounted on the PCB, and including an optical transmitter element such as an optical modulator chip, or an optical receiver chip; and an FPC that electrically connects a signal pad of the PCB and a signal pad of the high-frequency package, and electrically connects a ground pad of the PCB and a ground pad of the high-frequency package, wherein a thickness of a substrate at a location of the ground pads of the PCB and the high-frequency package are disposed is thinner than a thickness of the substrate at a location that each of the signal pads of the PCB and the high-frequency package is disposed, and a thickness of a ground pad of the FPC is thicker than a thickness of a signal pad of the FPC.

2. The optical module according to claim 1, wherein the PCB, the high-frequency package, and the FPC have differential drive structures in a GSSG or GSGSG configuration.

3. The optical module according to claim 1, wherein a width of the signal pad in a direction that the ground pads are arranged is 100 μm or more and 300 μm or less, a width of the ground pad in a direction that the signal pads are arranged is 1.5 times or more the width of the signal pad, and a channel pitch is 1 mm or more.

4. The optical module according to claim 1, wherein at least a part of the ground plane has a cut-out structure cut out in a range from a center to an area immediately below the ground pad.

5. The optical module according to claim 1, wherein a surface that the signal pad and the ground pad face each other has a meandering structure.

6. The optical module according to claim 1, wherein an outermost one of the ground pads further includes an alignment mark.

7. The optical module according to claim 1, wherein the FPC composed of either a liquid crystal polymer or a fluoropolymer.

8. The optical module according to claim 1, wherein the connection pads are bonded by soldering with a melting point of 230° C. or less.

* * * * *